US006593065B2

(12) United States Patent
Scherer

(10) Patent No.: US 6,593,065 B2
(45) Date of Patent: Jul. 15, 2003

(54) METHOD OF FABRICATING NANOMETER-SCALE FLOWCHANNELS AND TRENCHES WITH SELF-ALIGNED ELECTRODES AND THE STRUCTURES FORMED BY THE SAME

(75) Inventor: Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 52 days.

(21) Appl. No.: 09/803,840

(22) Filed: Mar. 12, 2001

(65) Prior Publication Data

US 2002/0127495 A1 Sep. 12, 2002

(51) Int. Cl.$^7$ .................................................. G03F 7/26
(52) U.S. Cl. ...................................... 430/314; 430/317
(58) Field of Search ................................ 430/311, 313, 430/317, 314; 216/17, 47

(56) References Cited

U.S. PATENT DOCUMENTS 5,882,983 A * 3/1999 Gardner ...................... 438/424
6,144,076 A  11/2000 Puchner et al. ............. 257/369

* cited by examiner

Primary Examiner—Kathleen Duda
(74) Attorney, Agent, or Firm—Daniel L. Dawes; Myers Dawes Andras & Sherman LLP

(57) ABSTRACT

The invention is directed to a method of fabricating sub-wavelength features in semiconductors and insulators by starting with optical lithography patterns defined in a resist and then employing shadow-evaporation and directional etching to define nano-scale features. The directionality of this process is used together with a carefully defined photoresist mask to define an ion etching mask which allows the formation of very narrow trenches adjacent to the photoresist regions. Such narrow trenches can be used for electrical device isolation, for the definition of very small flow channels, and for the deposition of very narrow electrical contacts and wires.

16 Claims, 6 Drawing Sheets

METHOD OF FABRICATING NANOMETER-SCALE FLOWCHANNELS AND TRENCHES WITH SELF-ALIGNED ELECTRODES AND THE STRUCTURES FORMED BY THE SAME

BACKGROUND OF THE INVENTION

1. Field of the Invention

The invention relates to the fabrication of structures with nanometer scale dimensions.

2. Description of the Prior Art

Lithography is generally used in conjunction with wet or dry etching procedures to define trenches for isolation, fluid flow, and narrow electrode devices in semiconductors and insulators. The ultimate widths of the resulting structures is determined by the minimum feature size of the lithography process, and, for photolithography, is limited by the diffraction of light. What is needed is an alternative method of fabricating sub-wavelength features in semiconductors and insulators.

BRIEF SUMMARY OF THE INVENTION

The invention is a method for forming a nano-scale trench in a substrate comprising the steps of disposing a first masking layer having a thickness, d, on a surface of the substrate. The first masking layer is then patterned according to design choice. Any pattern may be employed. Whereas the illustrated embodiment shows a multiple number of straight lines used to define trenches or channels, any curvilinear pattern forming a connected or disconnected network may be chosen consistent with the technique of shadow or directional evaporative deposition. A second masking layer is disposed on the patterned first masking layer using angled deposition of the second masking layer to define an exposed trench window through the second masking layer by shadow deposition relative to the first masking layer. The trench is defined into the substrate through the exposed trench window. The first and second masking layers are removed to leave a trenched surface of the substrate, which may then be used in subsequence processing steps to make channels, wires and other nano-scale structures.

A repeated cycle of the forgoing steps after the processed substrate has been rotated, can define trenches in the substrate at a different angle depending on the rotation. For example, straight trenches crossing each other at right angles can be formed by repeating the process steps twice in two cyclic groups to produce a grid of trenches if desired.

The step of defining the trench into the substrate through the exposed trench window comprises directionally etching the trench into the substrate in a direction substantially perpendicular to the plane of the substrate.

The step of defining the trench into the substrate through the exposed trench window defines a trench window of width w, where $w = d \sin \theta$ and where $\theta$ is the angle of incidence of the angled deposition of the second masking layer.

The step of disposing the second masking layer on the patterned first masking layer using angled deposition of the second masking layer comprises disposing the second masking layer by directional evaporation of material composing the second masking layer.

The method further comprises disposing a sealing layer over the trench to hermetically seal the trench to define a fluidic channel, which sealing layer in one embodiment is an elastomeric layer.

The method further comprises the step of disposing a cantilever over the trench. The cantilever completely crosses the trench but may or may not be in contact with both sides of the substrate surface on opposite sides of the trench, in other words, the possibility exists that the cantilever may extend over, but not be in actual contact with one side of the surface of the substrate on opposite sides of the trench. In one embodiment the cantilever is a polymeric molecule disposed over the trench, such as a DNA molecule. In another embodiment the cantilever may be a carbon nanotube. The method further comprises the step of disposing a conductive layer onto the cantilever to form a bridge to electrically connect adjacent contact regions separated by the trench. In the illustrated embodiment the method comprises the step of forming the adjacent contact regions separated by the trench simultaneously with the bridge.

The method further comprises the step of disposing a conductive layer into the trench to form a wire. In one embodiment the step of disposing the conductive layer into the trench to form the wire comprises disposing the conductive layer onto the planar surface of the substrate and into the trench and then removing the conductive layer from the planar surface of the substrate.

The invention is also characterized as the structure or apparatus formed by the above methodology.

While the method has been described for the sake of grammatical fluidity as steps, it is to be expressly understood that the claims are not to be construed as limited in any way by the construction of "means" or "steps" limitations under 35 USC 112, but to be accorded the full scope of the meaning and equivalents of the definition provided by the claims. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The invention is directed to a method of fabricating sub-wavelength features in semiconductors and insulators by starting with optical lithography patterns defined in a resist and then employing shadow-evaporation and directional etching to define much smaller features. Deposition of masks by vacuum evaporation can be a very directional process. Depending on the source size, and the distance between the source and the sample to be deposited on, this technique can be used to generate high anisotropy and directionality. Typically, such directionality is used when employing "lift-off" processing, a common tone-reversal process used for metallization in the semiconductor industry.

Here we use the directionality of this process, together with a carefully defined photoresist mask, in order to define an ion etching mask which allows the formation of very narrow trenches adjacent to the photoresist regions. Such narrow trenches can be used for electrical device isolation, for the definition of very small flow channels, and for the deposition of very narrow electrical contacts and wires. We have demonstrated the methods of constructing 60 nanometer wide channels over several centimeter long regions by using standard optical lithography followed by shadow evaporation and directional reactive ion etching.

Figure 1A:
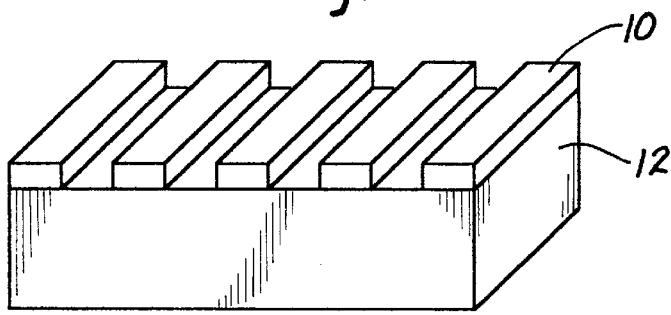
FIGS. 1a–1d are diagrammatic side cross-sectional views in enlarged scale of the steps of the process of the invention.
Figure 1B:
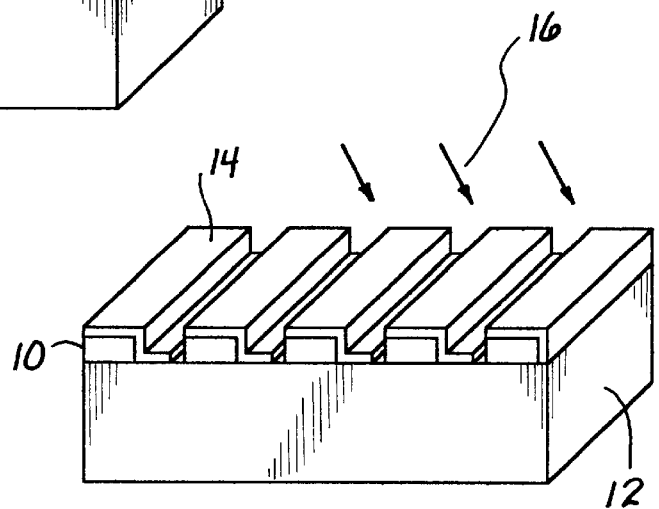
Figure 1C:
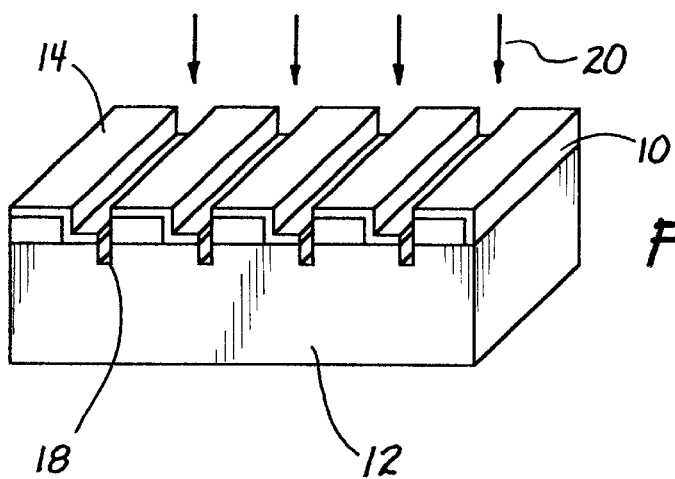
Figure 1D:
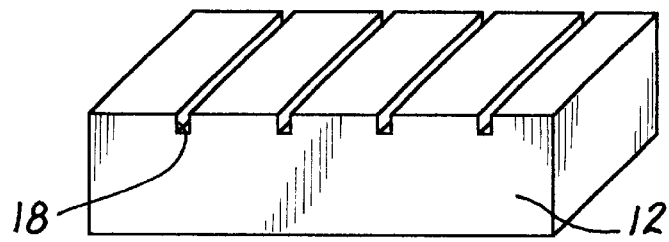

The method used to define narrow channels is depicted in FIGS. 1a–1d, which are diagrammatic cross-sectional views in enlarged scale of the steps of the process of the invention. First, as shown in FIG. 1a a pattern is defined in a mask or layer 10 on a substrate 12 by conventional photolithography using UV radiation. Then, as shown in FIG. 1b the sample 10, 12 is coated directionally as depicted symbolically by arrows 16 at an angle with a mask material 14 which is vacuum evaporated in a conventional manner. After the evaporation process, the sample 10, 12, 14 is etched directionally in a reactive ion etching system as shown in FIG. 1c to create trenches 18 in substrate 12. In the illustrated embodiment the direction etching is vertical with respect to the planar aspect of substrate 12 as symbolically denoted by arrows 20, but the invention contemplates arbitrary directional etching. Finally, the mask material and photoresist are removed as shown in FIG. 1d leaving trenches 18 in substrate 12 as the upper planar aspect of sample 12, 18.

Figure 2:
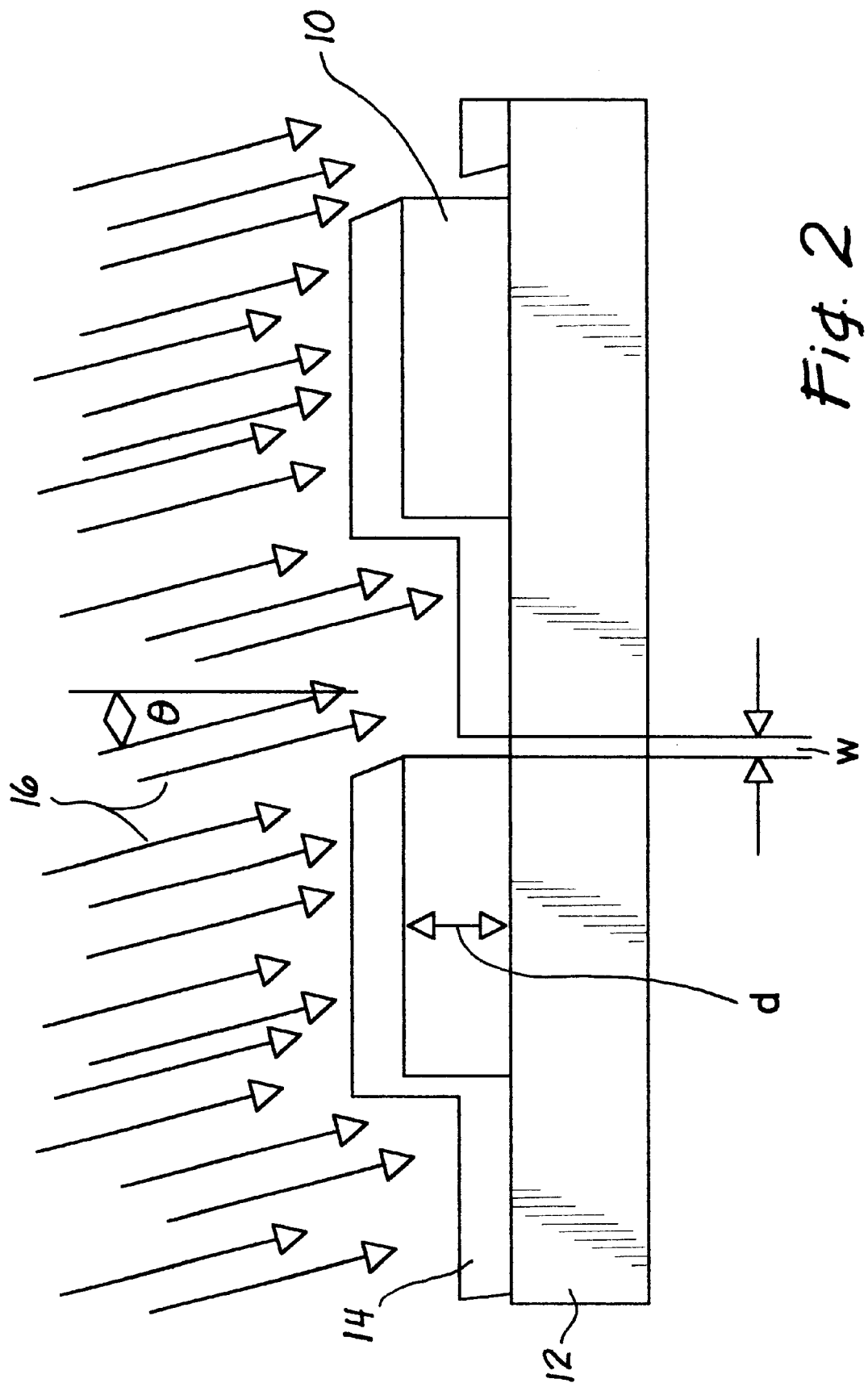
FIG. 2 is a side cross-sectional diagram illustrating the geometric effect resulting from angle evaporation with a collimated source, yielding a gap width w which is controlled by the photoresist thickness d and the sample tilt θ.

This procedure provides the basis for inexpensive fabrication of fluidic devices and electronic devices in which very narrow channels or electrical wires defined in trenches 18 are needed over large areas. The length of the channels is limited by the lithographic pattern defined during the photolithography process in the first step in FIG. 1a, whereas the width of the channels is defined by the height of the photoresist 10, the angle 16 of evaporation, and the directionality of the evaporation process in FIG. 1b. The geometry defining the channel width is better described in connection with FIG. 2, which shows a cross-sectional view through the photoresist layers 10 and 14. If we assume an angle of incidence of $\theta$ degrees, and photoresist height of d of layer 10, then the width of the gap (w) which a collimated beam of atoms will leave by shadowing next to the resist 10 will be $d \sin \theta$, assuming that the thickness d of resist 10 is much larger than the deposited film thickness of resist layer 14. Thus, it is clearly possible to obtain very small lateral widths of trenches or channels 18 by careful adjustment of the angle 16 of evaporation and the thickness d of the resist layer 10. Although straight trenches are shown, it is possible to make curved trenches to at least a limited degree using the same shadowing technique. The illustrated embodiment assumes that the direction of shadowing angle 16 is uniform, planar and defined in a plane with is perpendicular to trenches 18. Shadowing still occurs, however, to some degree if the trenches are curved by a correspondingly curved layer 10. The width, w, of trenches 18 if curved, however, will not be uniform along its length or given by the above formula. The width, w, of trenches 18, if curved, can be compensated by altering the thickness, d, of layer 10 to lengthen a foreshortened shadow of an obliquely oriented layer 10 to the planar wavefront of evaporative deposition of layer 14 according to the geometry of the configuration. In most applications it is expected that such geometrical complications will not be required or only straight trenches 18 will be required.

Figure 3:
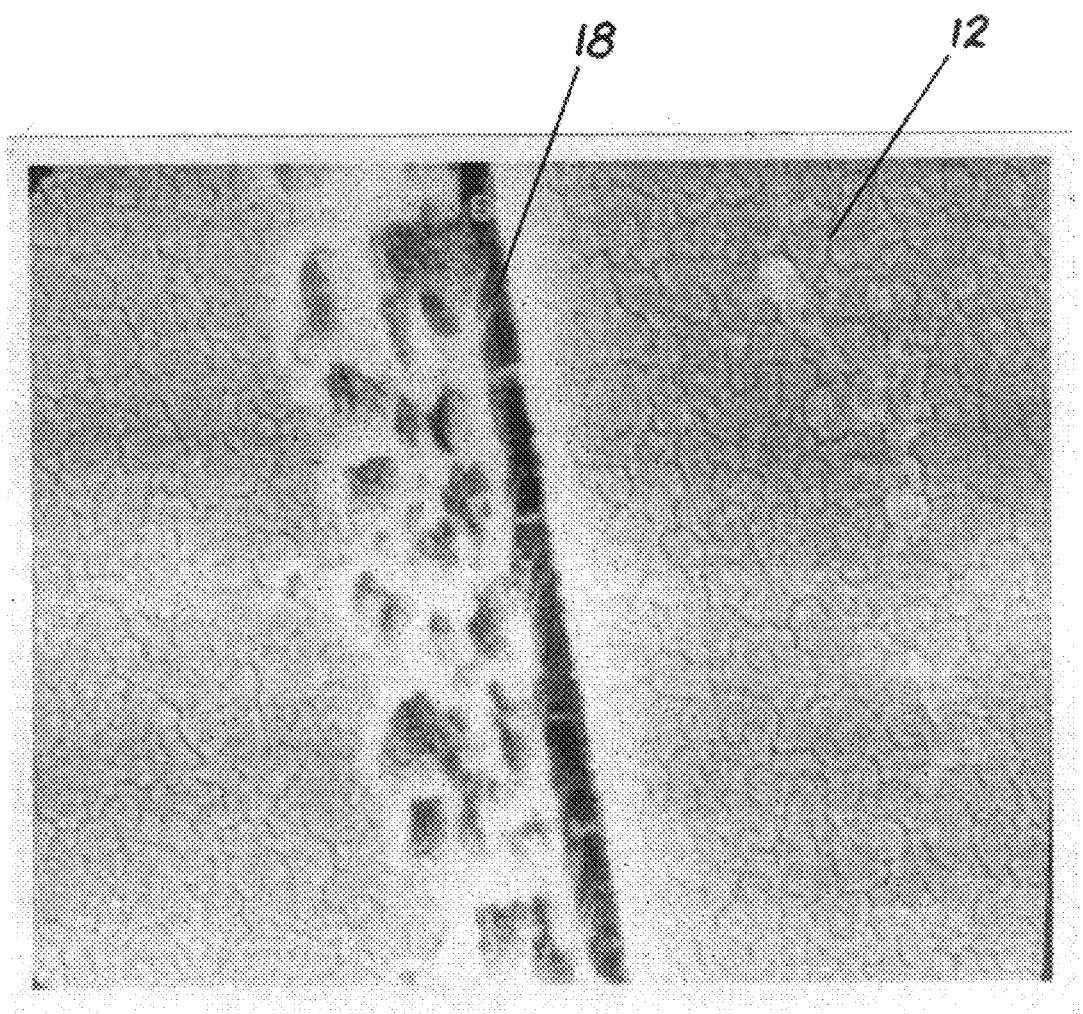
FIG. 3 is a scanning electron microscope image of the top plan view of a part of a completed sample after the etching step of FIG. 1d was completed showing a 60 nm wide trench.

We have recently shown that this is possible on a silicon dioxide substrate 12, which was patterned with a photoresist pattern of approximately 3 micrometer width features in layer 10. Then, chromium as layer 14 was angle-evaporated onto this patterned sample, and the sample was subsequently etched in a reactive ion etching system with a $C_2F_6$ radiofrequency plasma to directionally attack the silicon dioxide substrate 12. FIG. 3 is a scanning electron microscope image of a part of the completed sample after the etching procedure was completed. The trenches 18 which were defined were measured to range from 40 to 60 nm in width.

Figure 4:
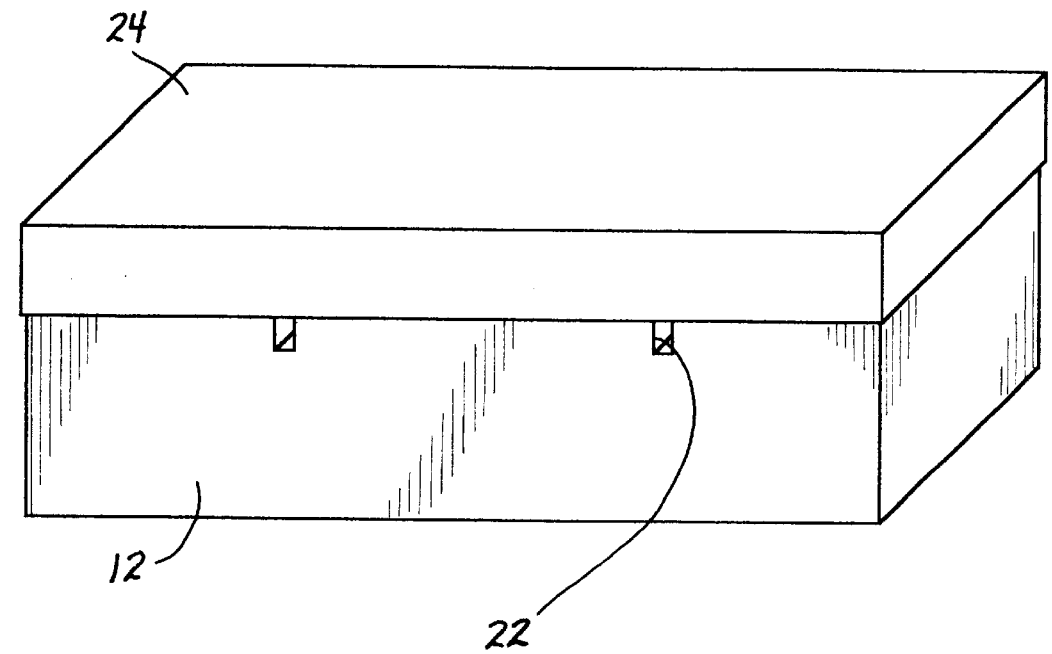
FIG. 4 is a side cross-sectional diagram illustrating the formation of a sealed fluidic channel.

Consider another embodiment in which fluidic channels 22 for picoliter volume sampling are formed. When channels 22 are fabricated according to the methods described above, these features can be converted into simple fluid-flow channels 22 by hermetically sealing their top surface. In the case of a silicon dioxide substrate 12, this can be accomplished most conveniently by depositing a elastomer membrane 24 over the top of the flow-channel as shown in FIG. 4. Then, larger reservoirs can be defined into the elastomeric flow channels 22, to feed solution into the very narrow fluid conduits. The procedure is illustrated in FIG. 4, where silicone elastomer 24 (RTV) is used to hermetically seal the fluid channels 22. Once channels 22 have been fabricated by ion etching as described in connection with FIGS. 1a–1d, the surface masks 10, 14 are removed, and elastomer 24 is placed on top of channels 22 to seal the solution in. This can be done by using flat pieces of RTV silicone, or polydimethylsilicone (PDMS).

In another embodiment as shown in FIGS. 5a–5f the invention uses the trenches 18 for the fabrication of very small cantilevers. Trenches 18 are bridged with either DNA molecules or with carbon nanotubes 26, which can be spun on or deposited from a solution. This allows the fabrication of very narrow "bridges" 28 which can then be deposited upon by angled vapor deposition. This allows electrical contact between regions of large metalized contacts through extremely narrow bridges 28. FIGS. 5a–5f summarizes the steps of this embodiment to define ultra-small bridges 28 with gold. It should be noted that any material which can be deposited by vacuum deposition can be used, and these materials include superconductors, semiconductors, magnetic materials, which should demonstrate quasi-one dimensional behavior in the very narrow geometries. The narrowest wires which we have so far fabricated by this technique are about 6 nm wide. The deposition of materials onto small cantilevers 26 which can span the 40–60 nm gaps allows us to form very narrow cantilevers 26 and resonators which demonstrate very high frequency behavior because of their low mass.

Figure 5A:
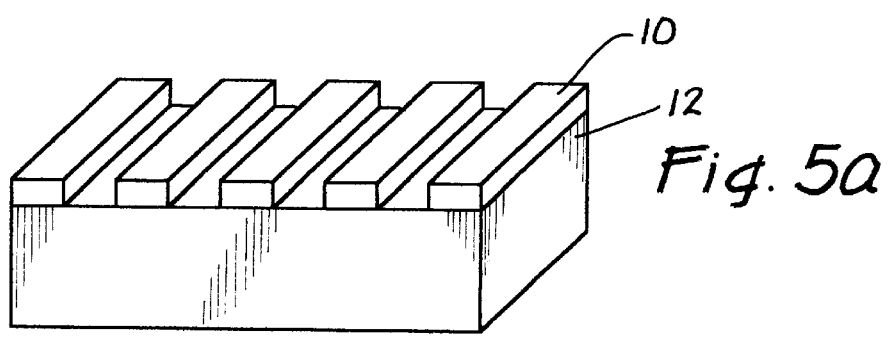
FIGS. 5a–5f are side cross-sectional views of the steps of fabrication of ultra small conductive bridges over the trenches connecting adjacent contact areas.
Figure 5B:
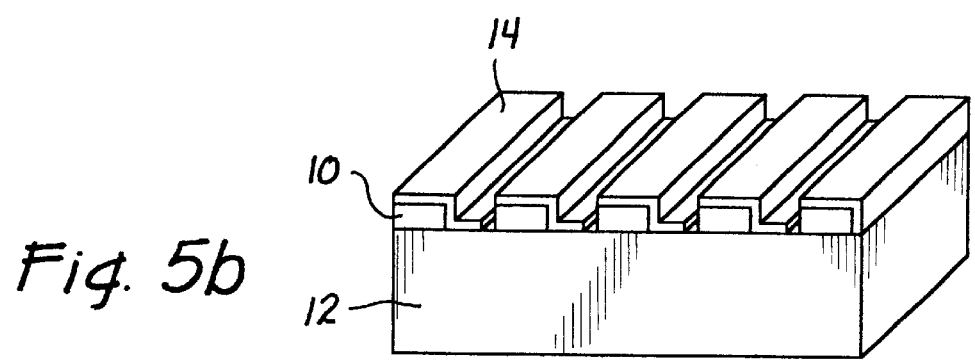
Figure 5C:
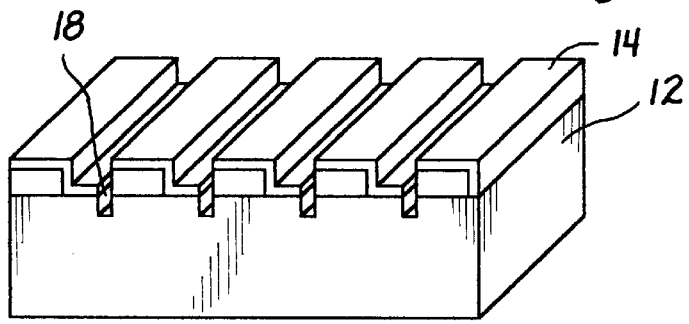
Figure 5D:
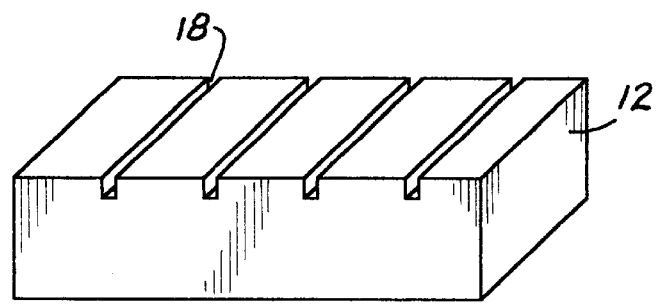
Figure 5E:
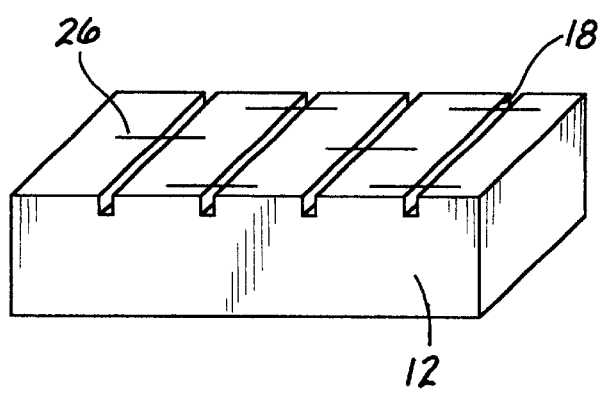
Figure 5F:
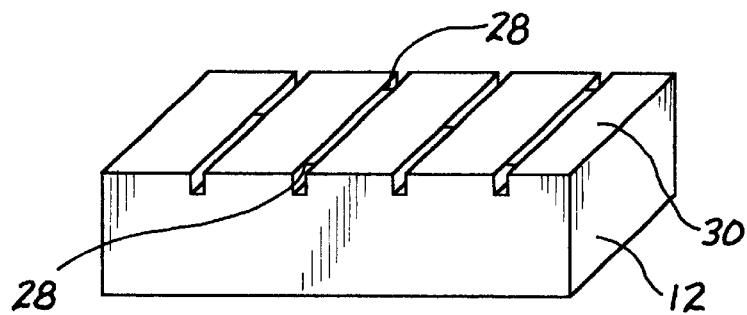

FIG. 5a is a diagrammatic side cross-sectional view of a patterned substrate 12 as in the case of FIG. 1a. FIG. 5b illustrates an angled deposition of a thin film mask 14 as in the case of FIG. 1b. FIG. 5c shows a directional etching of the exposed trench widths, w, as in FIG. 1c. FIG. 5d is similar to FIG. 1d in that a trenched, bare substrate surface is rendered. FIG. 5e depicts the deposition of cantilevers 26 of DNA or carbon nanotubes across trenches 18. FIG. 5f depicts the final step wherein gold is then deposited by angled vapor deposition on all exposed surfaces to render a metalized contact region 30 with extremely narrow gold bridges 28 over trenches 18 separating contact regions 30. It should be noted that any material which can be deposited by vacuum deposition can be used, and these materials include superconductors, semiconductors, magnetic materials, which should demonstrate quasi-one dimensional behavior in the very narrow geometries. The narrowest wires which we have so far fabricated by this technique are about 6 nm wide.

Figure 6A:
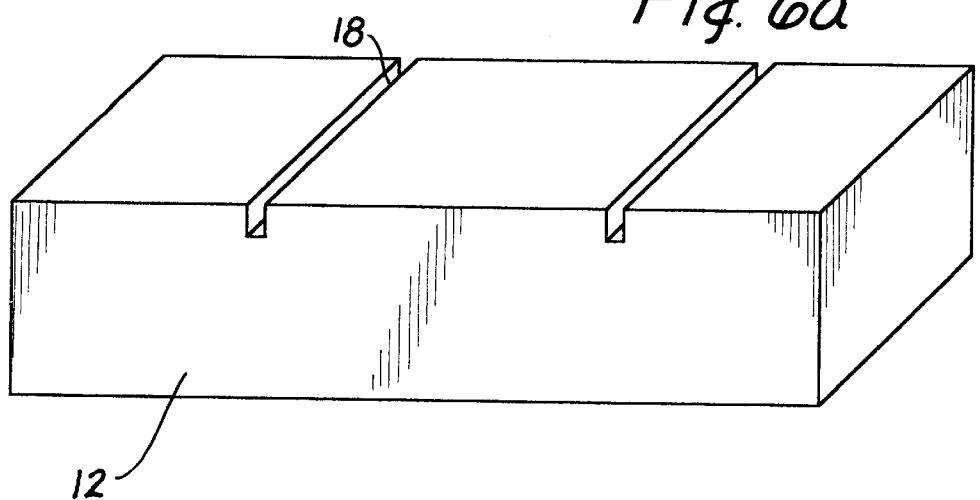
FIGS. 6a–6c are side cross-sectional views of the steps of fabrication of ultra thin wires using the methodology of the invention.
Figure 6B:
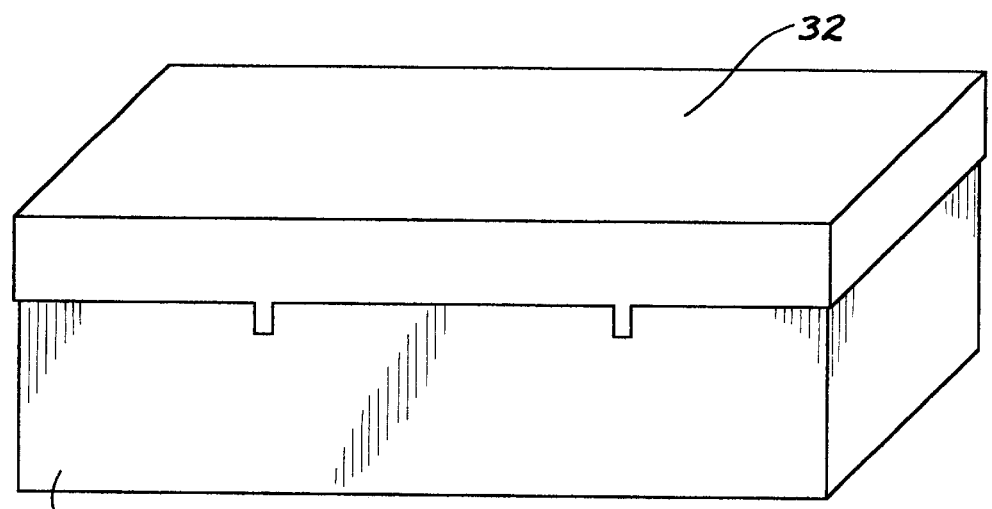
Figure 6C:
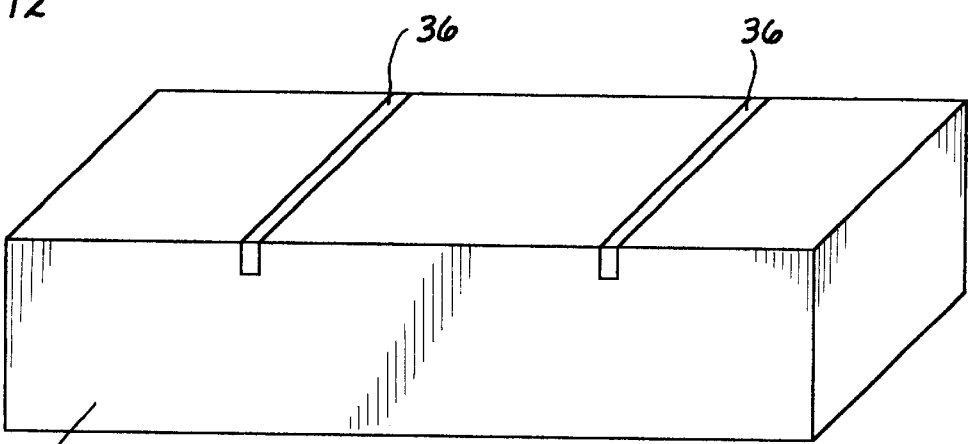

The very narrow trenches 18 formed in substrate 12 as shown in FIG. 6a can also be filled with a metal 32 by using a sputter deposition or vapor deposition process as diagrammatically depicted in FIGS. 6a–6c. Metal 32 deposited onto the surface 34 of substrate 12 in FIG. 6b can be polished off, and very small wires 36 with lateral widths, w, defined by the angle-evaporation process result as shown in FIG. 6c.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. A method for forming a nano-scale trench in a substrate comprising:

disposing a first masking layer having a thickness, d, on a surface of said substrate;

patterning said first masking layer;

disposing a second masking layer on the patterned first masking layer using angled deposition of said second masking layer to define an exposed trench window through said second masking layer by shadow deposition relative to said first masking layer;

defining said trench into said substrate through said exposed trench window; and removing said first and second masking layers.

2. The method of claim 1 where defining said trench into said substrate through said exposed trench window comprises etching said trench into said substrate.

3. The method of claim 2 where etching said trench into said substrate comprises directionally etching said trench into said substrate.

4. The method of claim 3 where said substrate has a planar aspect and where directionally etching said trench into said substrate comprises etching said trench into said substrate in a direction substantially perpendicular to said planar aspect of said substrate.

5. The method of claim 1 where defining said trench into said substrate through said exposed trench window defines a trench window of width w, where $w = d \sin \theta$, where $\theta$ is the angle of incidence of said angled deposition of said second masking layer.

6. The method of claim 1 where disposing said second masking layer on said patterned first masking layer using angled deposition of said second masking layer comprises disposing said second masking layer by directional evaporation of material composing said second masking layer.

7. The method of claim 1 further comprising disposing a sealing layer over said trench to hermetically seal said trench to define a fluidic channel.

8. The method of claim 7 where disposing said sealing layer over said trench comprises disposing an elastomeric layer.

9. The method of claim 1 further comprising disposing a cantilever over said trench.

10. The method of claim 9 where disposing said cantilever over said trench comprises disposing a polymeric molecule over said trench.

11. The method of claim 10 where disposing said polymeric molecule over said trench comprises disposing a DNA molecule over said trench.

12. The method of claim 9 where disposing said cantilever over said trench comprises disposing a carbon nanotube over said trench.

13. The method of claim 9 further comprising disposing a conductive layer onto said cantilever to form a bridge to electrically connect adjacent contact regions separated by said trench.

14. The method of claim 13 further comprising forming said adjacent contact regions separated by said trench simultaneously with said bridge.

15. The method of claim 1 further comprising disposing a conductive layer into said trench to form a wire.

16. The method of claim 15 where said substrate has a planar surface and where disposing said conductive layer into said trench to form said wire comprises disposing said conductive layer onto said planar surface of said substrate and into said trench and then removing said conductive layer from said planar surface of said substrate.

* * * * *